(12) United States Patent
Chen et al.

(10) Patent No.: US 11,227,742 B1
(45) Date of Patent: Jan. 18, 2022

(54) ELECTRON MICROSCOPIC SPECIMEN, AND METHODS FOR PREPARING AND PERFORMING MICROSCOPIC EXAMINATION OF THE SAME

(71) Applicant: National Tsing Hua University, Hsinchu (TW)

(72) Inventors: Chien-Chun Chen, Hsinchu (TW); Yu-Ting Peng, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 17/148,979

(22) Filed: Jan. 14, 2021

(30) Foreign Application Priority Data

Oct. 20, 2020 (TW) .................................. 109136227

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/0203* (2013.01)

(58) Field of Classification Search
CPC ..... H01J 37/20; H01J 37/28; H01J 2237/0203
See application file for complete search history.

(56) References Cited

U.S. PATENT DOCUMENTS

| | | | |
|---|---|---|---|
| 3,386,717 A * | 6/1968 | Foster | C22F 1/02 148/535 |
| 3,402,458 A * | 9/1968 | Asaff | C04B 37/026 228/124.1 |
| 7,732,301 B1 * | 6/2010 | Pinnington | H01L 21/2654 438/455 |
| 9,650,723 B1 * | 5/2017 | D'Evelyn | H01L 21/2007 |
| 2005/0215073 A1 * | 9/2005 | Nakamura | H01L 21/6831 438/778 |
| 2008/0319143 A1 * | 12/2008 | Kniajanski | G02B 27/0006 525/474 |

(Continued)

FOREIGN PATENT DOCUMENTS

| CN | 104181143 A | 12/2014 |
|---|---|---|
| TW | I697402 B | 7/2020 |

OTHER PUBLICATIONS

G. S. Was et al. "Resolution of the carbon contamination problem in ion irradiation experiments", Nuclear Instruments and Methods in Physics Research B: Beam Interactions with Materials and Atoms, vol. 412, 2017, pp. 58-65.

(Continued)

*Primary Examiner* — David A Vanore
(74) *Attorney, Agent, or Firm* — Hamre, Schumann, Mueller & Larson, P.C.

(57) ABSTRACT

An electron microscopic specimen includes a carrier for an electron microscope, an object, and a protective layer. The object is adapted for microscopic examination using the electron microscope, and is disposed on a surface of the carrier. The protective layer is made from amorphous aluminium oxide, and is disposed over the object, such that the object is enclosed between the carrier and the protective layer. The protective layer has a thickness not greater than 5 nm. A method of making the electron microscopic specimen, and a method for microscopic examination of the specimen are also disclosed.

15 Claims, 7 Drawing Sheets

(56) References Cited

U.S. PATENT DOCUMENTS

2016/0163506 A1    6/2016  Arjavac et al.
2018/0033905 A1*   2/2018  Augusto ............. H01L 31/1884
2021/0028331 A1*   1/2021  Ting ................... H01L 33/0095

OTHER PUBLICATIONS

M. T. Myers et al. "Tailoring radiation damage in ZnO by surface modification", Applied Surface Science, vol. 276, 2013, pp. 129-132.
Wenchang Zhu, et al., "Ultrathin Al2O3 Coating on LiNi0.8Co0.1Mn0.1O2 Cathode Material for Enhanced Cycleability at Extended Voltage Ranges", Coatings 2019, 9, 92, total 12 pages.
Search Report appended to an Office Action, which was issued to Taiwanese counterpart application No. 109136227 by the TIPO on Oct. 10, 2021, with an English translation thereof (2 pages).

* cited by examiner

ELECTRON MICROSCOPIC SPECIMEN, AND METHODS FOR PREPARING AND PERFORMING MICROSCOPIC EXAMINATION OF THE SAME

CROSS-REFERENCE TO RELATED APPLICATION

This application claims priority of Taiwanese Invention Patent Application No. 109136227, filed on Oct. 20, 2020.

FIELD

The disclosure relates to a specimen and making method and microscopic examination method thereof, and more particularly to an electron microscopic specimen and making method and microscopic examination method thereof.

BACKGROUND

Electron microscopes (e.g., scanning electron microscope (SEM), transmission electron microscope (TEM) and scanning transmission electron microscope (STEM), etc.) are commonly used in academia and industry to perform microscopic examination, material analysis or three-dimensional (3D) image acquisition of a nanometer-sized specimen or a micrometer-sized specimen. To be specific, an electron beam is irradiated on a specimen, so that the crystalline structure and surface topography measured from different angles of the specimen are obtained upon electron scattering caused by electron collision on the surface of the specimen and based on quantum tunneling effect. The data collected from different angles of the specimen are then integrated to produce the 3D image of the specimen.

However, a relatively long period of imaging time using the electron microscope (such as TEM) is required to obtain the 3D image of the specimen. The longer the period of imaging time, the more likely the specimen would be damaged due to prolonged exposure to electron beam, or the more likely carbon deposition would occur on the surface or periphery of the specimen, which in turn reduces the quality of the thus obtained 3D image.

SUMMARY

Therefore, an object of the disclosure is to provide an electron microscopic specimen, and a making method and a microscopic examination method thereof that can alleviate at least one of the drawbacks of the prior art.

According to the present disclosure, the electron microscopic specimen includes a carrier for an electron microscope, an object and a protective layer. The object is adapted for microscopic examination using the electron microscope, and is disposed on a surface of the carrier. The protective layer is made from amorphous aluminium oxide and is disposed over the object, such that the object is enclosed between the carrier and the protective layer. The protective layer has a thickness not greater than 5 nm.

The method of making the electron microscopic specimen for microscopic examination using an electron microscope includes the steps of:
  providing a carrier for the electron microscope;
  disposing an object for microscopic examination on a surface of the carrier;
  forming a protective layer on the object such that the object is enclosed between the carrier and the protective layer. The protective layer is made from amorphous aluminium oxide and has a thickness not greater than 5 nm.

The method for microscopic examination of a specimen includes the steps of:
  providing a carrier for an electron microscope;
  disposing an object for microscopic examination on a surface of the carrier;
  forming a protective layer on the object such that the object is enclosed between the carrier and the protective layer thereby obtaining the specimen, the protective layer being made of amorphous aluminium oxide and having a thickness not greater than 5 nm;
  irradiating the specimen with an electron beam emitted from the electron microscope; and
  generating an image of the specimen.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
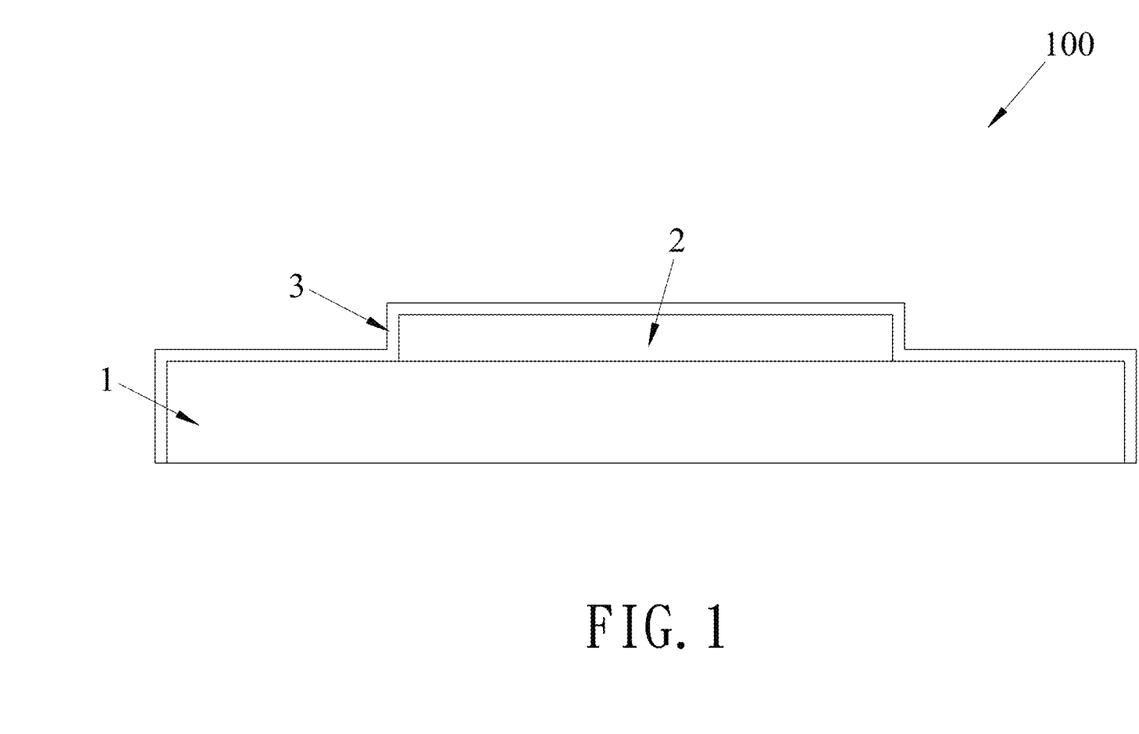
FIG. 1 is a schematic side view illustrating an embodiment of an electron microscopic specimen according to the disclosure.
Figure 3:
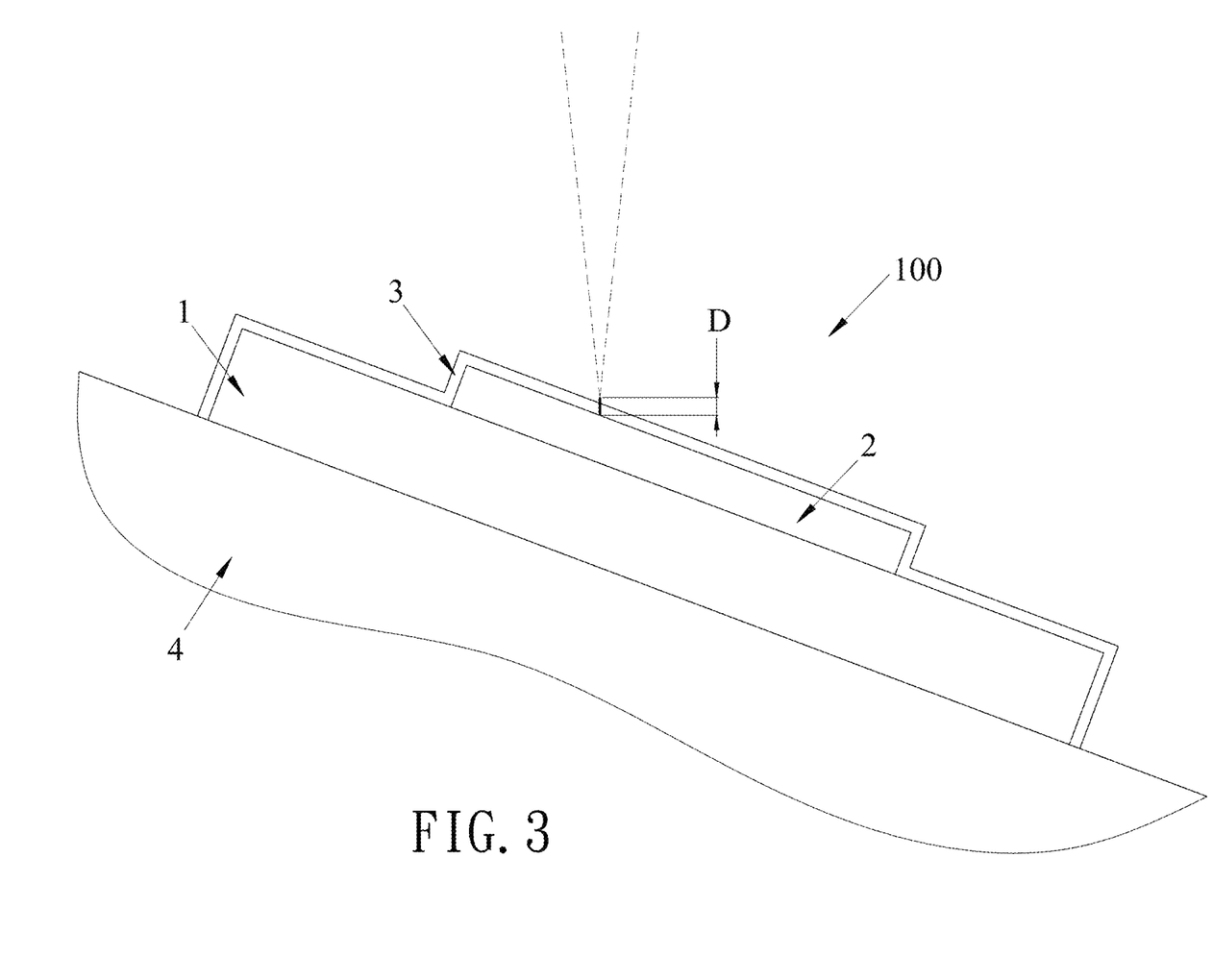
FIG. 3 is a schematic sectional view taken along line III-III of FIG. 2, illustrating the step of irradiating the electron microscopic specimen with the electron beam as the specimen holder is being rotated.

Referring to FIGS. 1 and 3, an embodiment of an electron microscopic specimen 100 according to the disclosure includes a carrier 1 for an electron microscope (such as a grid or a post), an object 2, and a protective layer 3.

The object 2 is disposed on a surface of the carrier 1. The object 2 may be any entity that is adapted for microscopic examination using the electron microscope. The shape and material of the object 2 are not limited specifically, and can be modified based on practical requirements as long as the object can be examined using the electron microscope.

The protective layer 3 is made of amorphous aluminium oxide, and is disposed over the object 2, such that the object 2 is enclosed between the carrier 1 and the protective layer 3. In this embodiment, the protective layer 3 further covers the surface of the carrier 1. The protective layer 3 has a thickness not greater than 5 nm. In certain embodiments, when an electron beam is irradiated onto the electron microscopic specimen 100 at a predetermined angle of incidence (e.g., not equal to 0°, that is, the electron beam irradiated in a direction not perpendicular to the surface of the carrier 1), the protective layer 3 is configured to allow the electron beam emitted from the electron microscope to travel a distance (D) not greater than 10 nm when passing through the protective layer 3.

A method of making the aforementioned electron microscopic specimen 100 includes the following consecutive steps (1) to (3).

In step (1), the carrier 1 for the electron microscope is provided.

In step (2), the object 2 for microscopic examination is disposed on the surface of the carrier 1. In certain embodiments, the object 2 is subjected to a cleaning process, e.g., a plasma surface treatment using a plasma including a noble gas. In this embodiment, the plasma surface treatment is conducted using argon. Specifically, when applying an electric field, the introduced argon gas ($A_2$) is dissociated into charged ions ($Ar^+$), and the contaminants on a surface of the object 2 can be absorbed by the resultant argon plasma, so as to clean the object 2. Since the plasma surface treatment is conducted without the use of any harmful chemicals or thermal treatment, it is suitable for cleaning the object 2 which may be made of variable materials (such as semiconductor materials, polymers or metals, etc) and which has a complicated structure.

In step (3), the protective layer 3 is formed on the object 2 such that the object 2 is enclosed between the carrier 1 and the protective layer 3. The protective layer 3 is made from amorphous aluminium oxide, and has a thickness not greater than 5 nm. In this embodiment, the step of forming the protective layer 3 is conducted by atomic layer deposition, so that the protective layer 3 is capable of being firmly attached to the object 2.

According to the present disclosure, the electron microscopic specimen 100 made by the abovementioned method can be observed using various electron microscopes which includes, but are not limited to, transmission electron microscope (TEM), scanning electron microscope (SEM), and scanning transmission electron microscope (STEM), etc. Therefore, the present disclosure also provides a method for performing microscopic examination of the electron microscopic specimen 100, which includes the aforesaid steps (1) to (3) for making the electron microscopic specimen 100, and steps (4) and (5) for examining and imaging the electron microscopic specimen 100 as described below.

Figure 2:
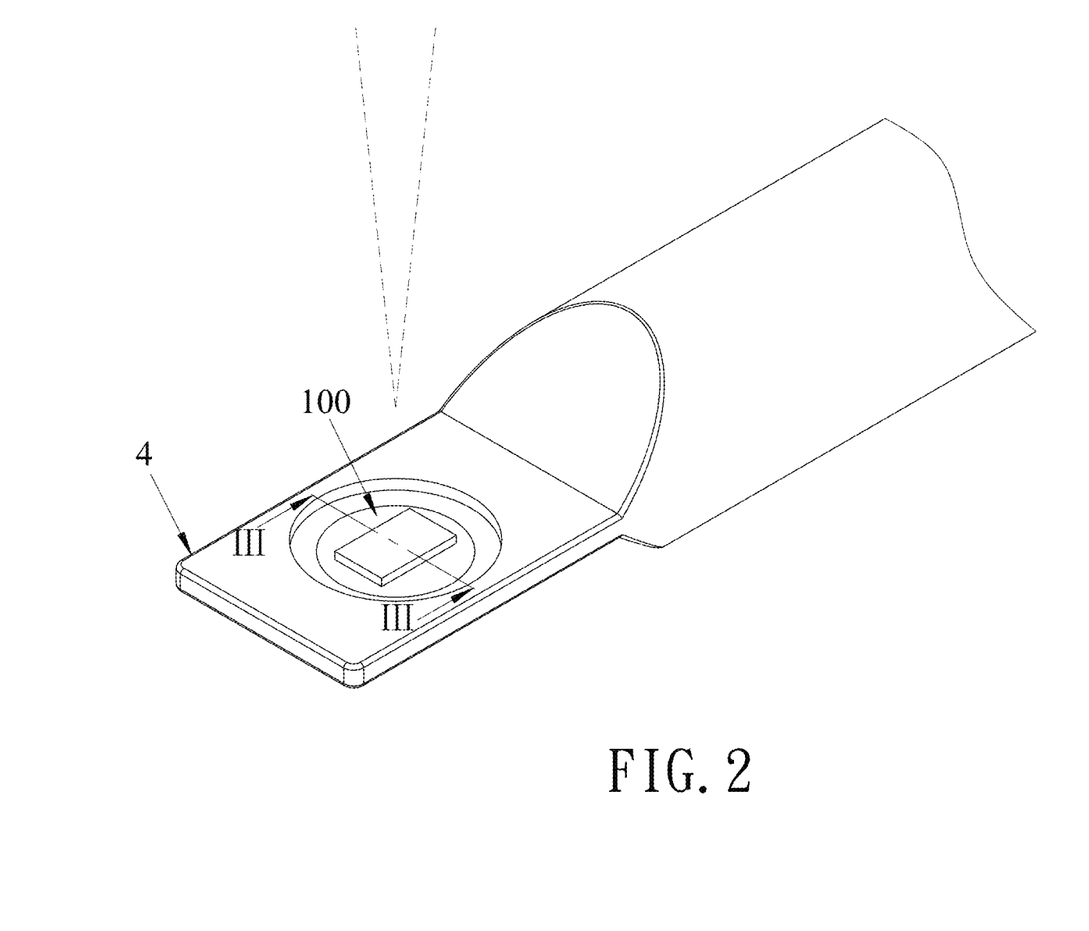
FIG. 2 is a schematic view illustrating a step of irradiating the electron microscopic specimen that is disposed on a specimen holder of a transmission electron microscope (TEM) with an electron beam.

Referring to FIG. 2, in step (4), the electron microscopic specimen 100 is irradiated with an electron beam emitted from the electron microscope, such as TEM used in this embodiment, but is not limited thereto. Then, an image of the specimen is generated in step (5). Specifically, the electron microscopic specimen 100 is disposed on a specimen holder 4 of the TEM, and introduced into a chamber (not shown in the figure) of the TEM so as to conduct microscopic examination thereof. Then, the electron beam is irradiated onto the electron microscopic specimen 100 in a vertical direction (i.e., vertical incidence as shown in FIG. 2). Some of the electrons from the electron beam penetrate through the electron microscopic specimen 100, while some of the electrons penetrate the protective layer 3 to collide and interact with the atoms on the surface of the object 2 so as to cause electron scattering. An internal structure of the object 2 can be revealed by collecting the scattered electrons and analyzing their travel directions, so as to generate a TEM image. In addition, the TEM could be switched to be operated in the STEM mode, i.e., scanning the electron microscopic specimen 100 using the electron beam to generate a STEM image. In some embodiments, since the scattered electrons may interfere with one another to cause electron diffraction, a diffraction pattern of the object 2 can also be obtained by collecting and analyzing the diffracted electrons, via, e.g., Fourier transformation.

When the STEM mode of the TEM is used to perform microscopic examination for the electron microscopic specimen 100, 3D imaging technique could also be applied to obtain a 3D image of the electron microscopic specimen 100. During such examination, the specimen holder 4 of the TEM may be rotated (see FIG. 3) to allow the electron beam to be incident on the electron microscopic specimen 100 at different angles of incidence (i.e., oblique incidence rather than vertical incidence shown in FIG. 2), so that a number of STEM images could be obtained from different angles of incidence, which are then analyzed and integrated to generate the 3D image. In such case, the electron beam travels a distance (D) not greater than 10 nm when passing through the protective layer 3. It should be noted that, the procedures and parameters for operating the TEM in the STEM mode or TEM mode are within the expertise of those skilled in the art, and thus the details thereof are omitted herein for the sake of brevity.

Since the protective layer 3 is made from amorphous aluminium oxide, when the electron beam passes through the protective layer 3, the electrons would not cause crystal diffraction to interfere with the imaging process of the object 2. Besides, since the protective layer 3 has a thickness not greater than 5 nm, or is further configured to allow an electron beam to travel a distance (D) not greater than 10 nm when passing through the protective layer 3, it ensures that the electron beam has sufficient energy to penetrate through the protective layer 3 so as to reach the object 2 in a case of vertical incidence or oblique incidence, and prevents the electron beam from travelling too long distance in the protective layer 3 to adversely affect the imaging process.

In the conventional microscopic examination of the object 2 (i.e., the object 2 is not covered by the protective layer 3), the contaminants on the surface of the object 2 or on the surroundings of the electron beam would be easily attracted by the electron beam during the imaging process, so that carbon deposited around the object 2 would adversely affect the image quality. Therefore, the protective layer 3 is capable of preventing the object 2 from being directly irradiated by the electron beam, so as to alleviate damages or deformation of the object 2 due excess energy received from the electron beam. In addition, the electron beam-induced carbon deposition could also be effectively reduced, and hence the image quality would not be decreased with an increased imaging time.

The present disclosure will be further described by way of the following examples. However, it should be understood that the following examples are intended solely for the purpose of illustration and should not be construed as limiting the present disclosure in practice.

Comparative Example 1 (CE1)

Figure 4:
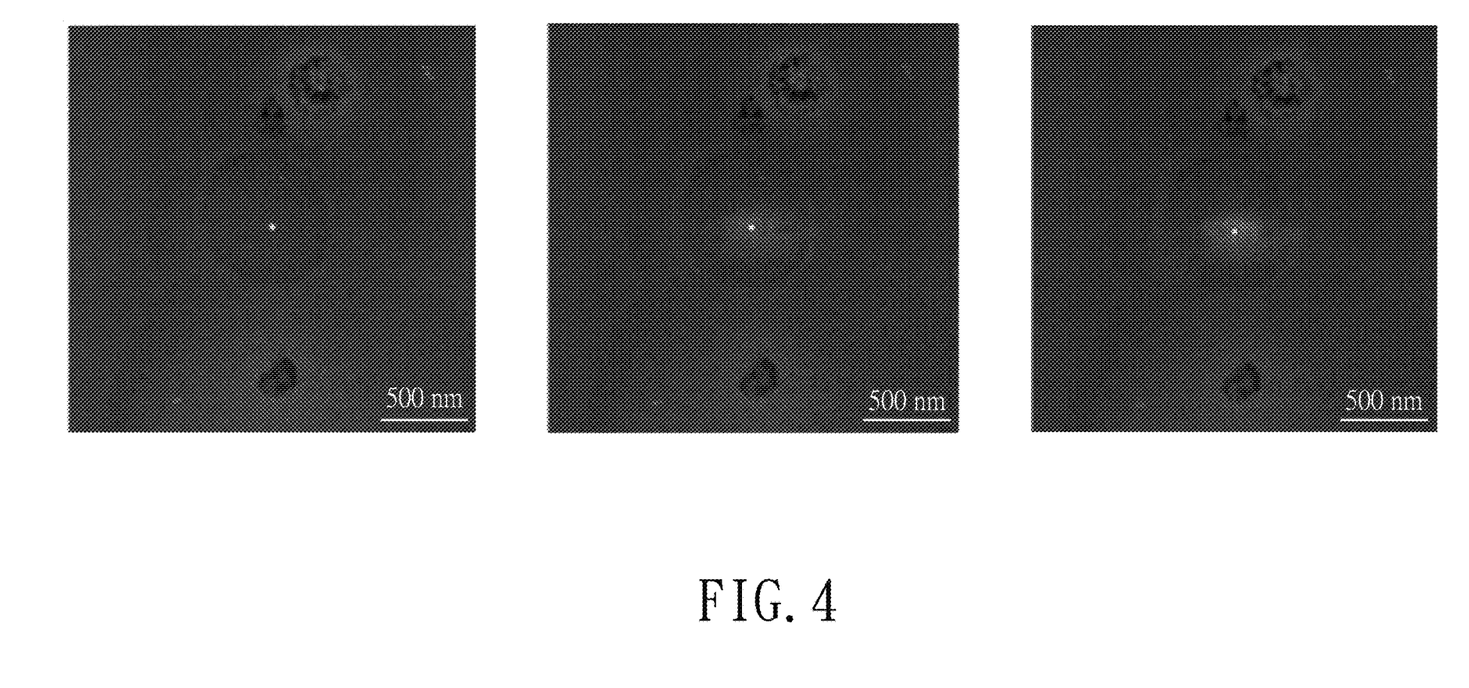
FIG. 4 shows STEM images of an electron microscopic specimen of Comparative Example 1 (CE1) at different time periods which are obtained using a TEM operated in an STEM mode.

Referring to FIG. 4, an electron microscopic specimen of Comparative Example 1 (CE1) is prepared by disposing metal nanoparticles which are made of platinum, rhodium and aurum (serving as the object) on the carrier (i.e., a TEM grid). The electron microscopic specimen of CE1 was placed on a specimen holder 4 of the TEM (FEI Titan™ G2 S/TEM), and then was subjected to an imaging process by operating the TEM in the STEM mode. The imaging process was conducted twice, and the duration of each imaging process is about 5 hours. The STEM images of the electron microscopic specimen obtained at the beginning of the imaging process, and after a first imaging process and a second imaging process with an identical imaging angle and position are respectively shown in the left panel, middle panel and right panel of FIG. 4.

By comparing the three STEM images in FIG. 4, it can be seen that with longer period of the imaging process, a halo pattern surrounding the metal nanoparticles became more obvious. These results indicate that when the electron microscopic specimen (without the protection layer 3 covering the object 2) is directly irradiated with the electron beam for a longer period (i.e., longer imaging time), carbon deposition on the periphery and surface of the object 2 becomes more severe, and thus the resultant image quality can be significantly reduced.

Example 1 (E1)

Figure 5:
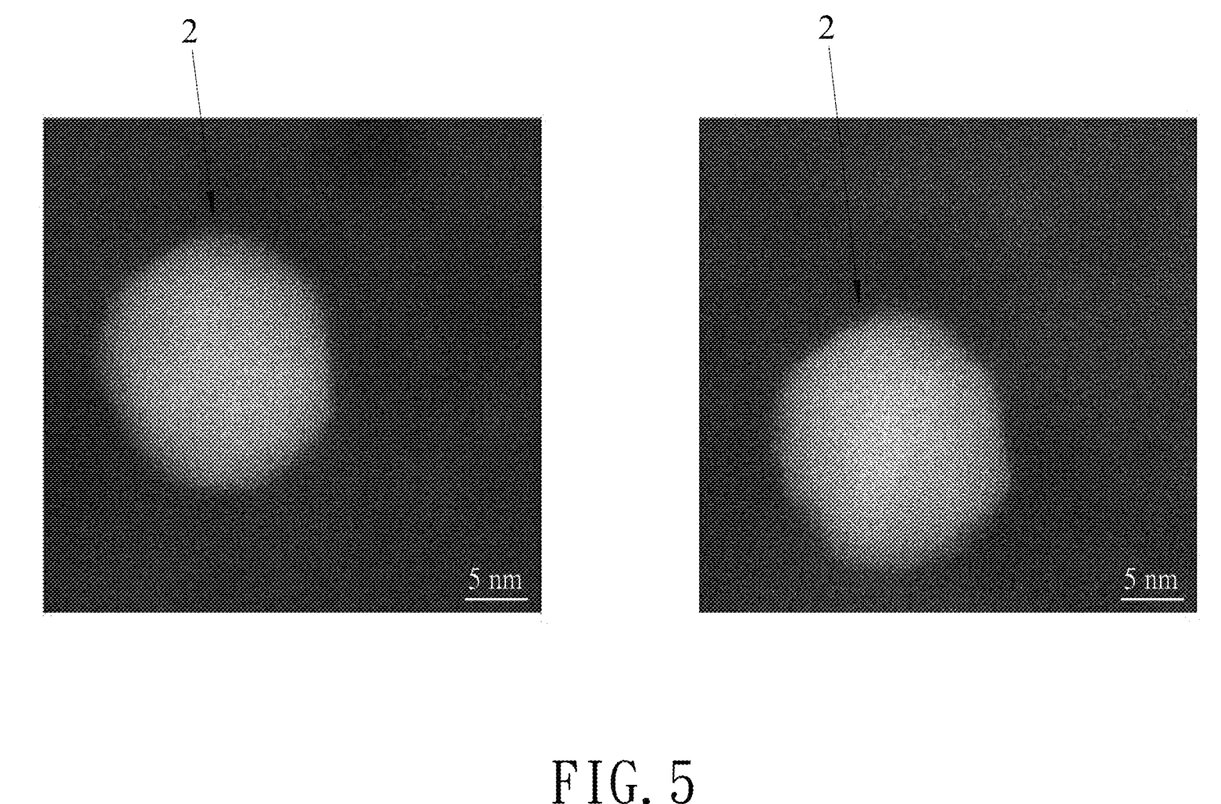
FIG. 5 shows STEM images of an electron microscopic specimen of Example 1 (E1) at different time periods which are obtained using the TEM operated in the STEM mode.

The electron microscopic specimen 100 of E1 is prepared by procedures similar to those of CE1, except that in E1, the protective layer 3 made from amorphous aluminium oxide is further disposed over the metal nanoparticles (i.e., the object 2) such that the object 2 is enclosed between the carrier 1 and the protective layer 3 (see FIG. 1). The electron microscopic specimen 100 of E1 was then subjected to an imaging process by operating the TEM in the STEM mode for 10 hours. The STEM images of the electron microscopic specimen 100 obtained at the beginning of the imaging process and after a 10 hour-imaging process were respectively shown in the left and right panels of FIG. 5. It can be seen from FIG. 5 that, the metal nanoparticles covered with the protective layer 3 are not damaged or deformed after a long period of irradiation with the electron beam, and carbon deposition does not occur at the periphery and surface of the metal nanoparticles, and thus, the quality of the STEM images can be maintained.

Example 2 (E2)

Figure 6:
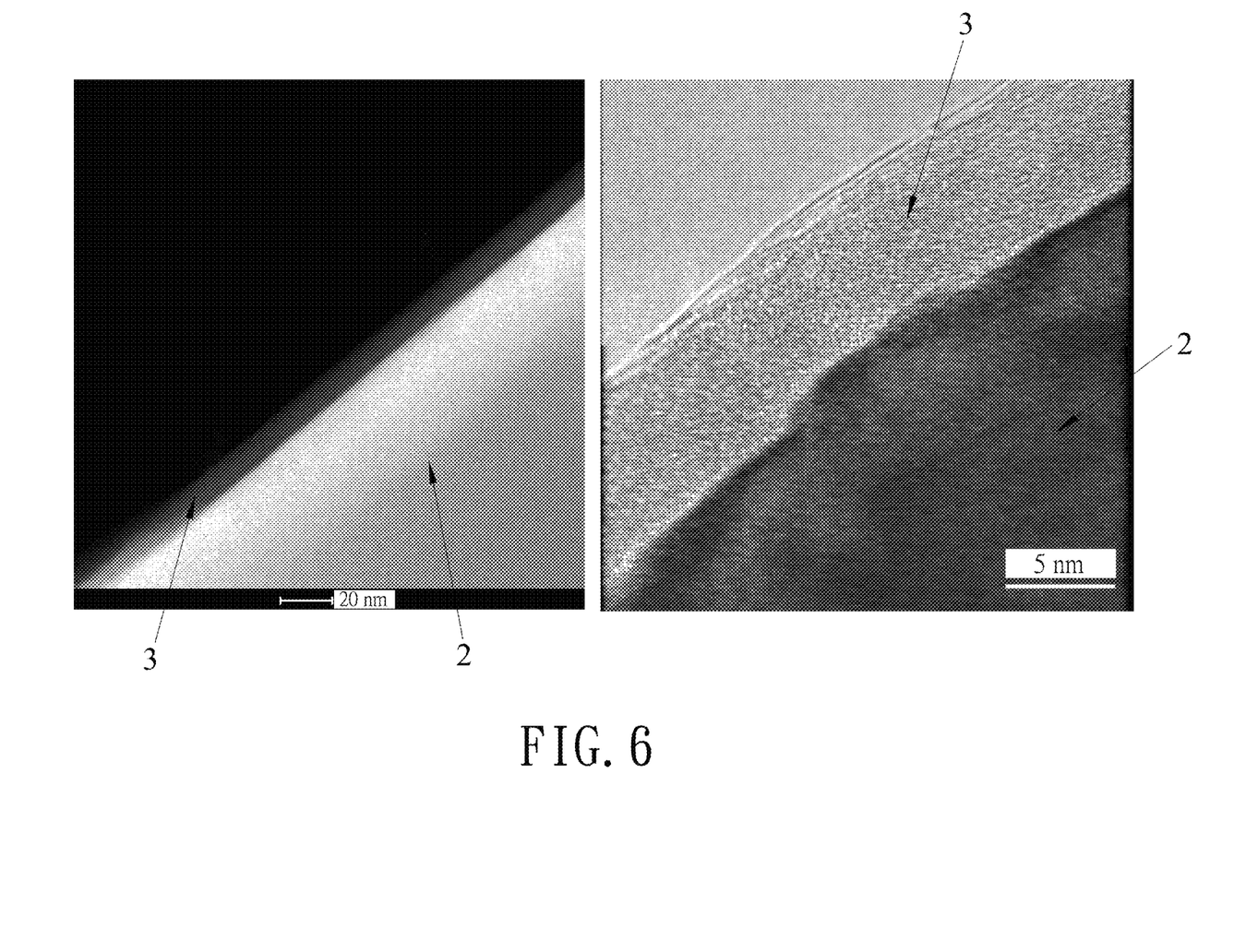
FIG. 6 shows a TEM image and a STEM image of an electron microscopic specimen of Example 2 (E2) which are obtained using the TEM respectively operated in the TEM mode and the STEM mode.

The electron microscopic specimen 100 of E2 is similar to E1, with the difference that the object 2 is a tungsten tip disposed on the carrier (i.e., a specimen post) and covered by the protective layer 3. The electron microscopic specimen 100 of E2 is subjected to an imaging process under TEM mode (at a magnification of $730kx$) and STEM mode (at a magnification of $120kx$) of the TEM, and the resultant TEM image and the STEM image are respectively shown in the right panel and left panel of FIG. 6. It can be seen from FIG. 6 that the surface of the tungsten tip (the object 2 of E2) is covered by the protective layer 3 which has a thickness of about 5 nm.

Figure 7:
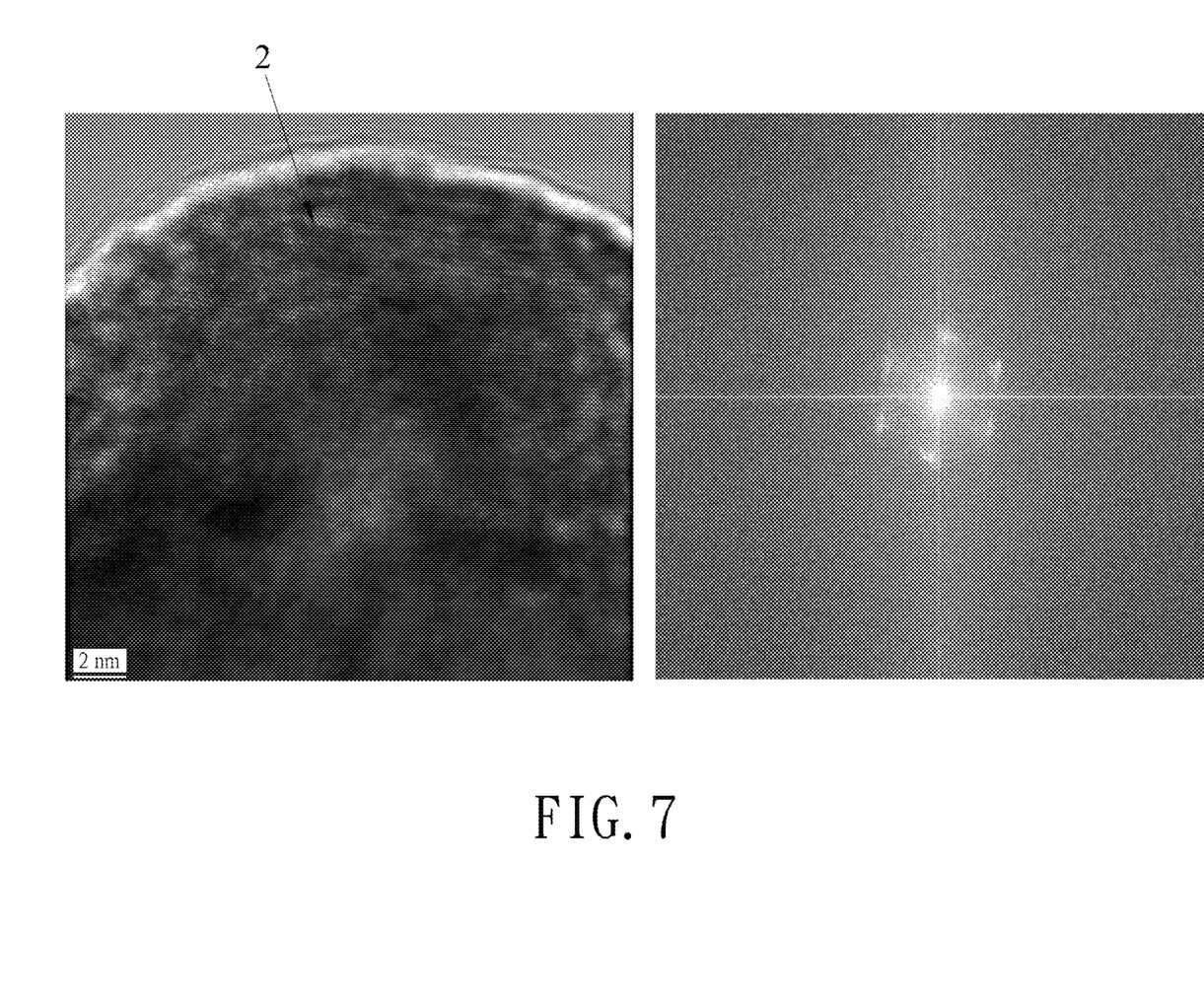
FIG. 7 shows a TEM image and a diffraction pattern of the electron microscopic specimen of E2.

Referring to FIG. 7, the TEM image of the electron microscopic specimen 100 obtained from another imaging angle (that is, facing the tip point of the tungsten tip) is shown in the left panel, and the diffraction pattern obtained from fast Fourier transformation (FFT) of such TEM image is shown in the right panel. It can be seen from FIG. 7 that the lattice points in the diffraction pattern of the electron microscopic specimen 100 of E2 have a desired resolution, indicating the formation of the protective layer 3 on the tungsten tip would not interfere with the microscopic examination of the object 2.

In summary, by forming the protective layer 3 that covers the object 2, the electron microscopic specimen 100 according to this disclosure provides a sufficient protection to the object 2 from damages or deformations due to irradiation of the electron beam and carbon deposition during the microscopic examination. Beside, the protective layer 3 which is made from aluminium oxide, and which has a thickness not greater than 5 nm, would not cause interference during microscopic examination of the object 2.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electron microscopic specimen, comprising:
    a carrier for an electron microscope;
    an object which is adapted for microscopic examination using the electron microscope, and which is disposed on a surface of said carrier; and
    a protective layer which is made from amorphous aluminium oxide, which is disposed over said object such that said object is enclosed between said carrier and said protective layer, and which has a thickness not greater than 5 nm.

2. The electron microscopic specimen according to claim 1, wherein said protective layer further covers said surface of said carrier.

3. The electron microscopic specimen according to claim 1, wherein said protective layer is configured to allow an electron beam emitted from the electron microscope to travel a distance not greater than 10 nm when passing through said protective layer.

4. A method of making an electron microscopic specimen for microscopic examination using an electron microscope, comprising the steps of:
    providing a carrier for the electron microscope;
    disposing an object for microscopic examination on a surface of the carrier;
    forming a protective layer on the object such that the object is enclosed between the carrier and the protective layer, the protective layer being made from amorphous aluminium oxide, and having a thickness not greater than 5 nm.

5. The method according to claim 4, wherein the step of forming the protective layer is conducted by atomic layer deposition.

6. The method according to claim 4, wherein the protective layer further covers the surface of the carrier.

7. The method according to claim 4, wherein before forming the protective layer, the object is subjected to a plasma surface treatment.

8. The method according to claim 7, wherein the plasma surface treatment is conducted using a plasma including a noble gas.

9. The method according to claim 4, wherein the protective layer is configured to allow an electron beam emitted from the electron microscope to travel a distance not greater than 10 nm when passing through the protective layer.

10. A method for microscopic examination of a specimen, comprising the steps of:
    providing a carrier for an electron microscope;
    disposing an object for microscopic examination on a surface of the carrier;
    forming a protective layer on the object such that the object is enclosed between the carrier and the protective layer thereby obtaining the specimen, the protective layer being made from amorphous aluminium oxide and having a thickness not greater than 5 nm;
    irradiating the specimen with an electron beam emitted from the electron microscope; and
    generating an image of the specimen.

11. The method according to claim 10, wherein in the irradiating step, the electron beam travels a distance not greater than 10 nm when passing through the protective layer.

12. The method according to claim 10, wherein the step of forming the protective layer is conducted by atomic layer deposition.

13. The method according to claim 10, wherein the protective layer further covers the surface of the carrier.

14. The method according to claim 10, wherein before forming the protective layer, the object is subjected to a plasma surface treatment.

15. The method according to claim 14, wherein the plasma surface treatment is conducted using a plasma including a noble gas.

* * * * *